US010763836B2

United States Patent
Kuo et al.

(10) Patent No.: US 10,763,836 B2
(45) Date of Patent: Sep. 1, 2020

(54) MEASURING CIRCUIT FOR QUANTIZING VARIATIONS IN CIRCUIT OPERATING SPEED

(71) Applicant: REALTEK SEMICONDUCTOR CORPORATION, Hsinchu (TW)

(72) Inventors: Chun-Yi Kuo, Taipei (TW); Ying-Yen Chen, Chiayi County (TW); Wen-Hsuan Hsu, Changhua County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/586,157

(22) Filed: Sep. 27, 2019

(65) Prior Publication Data

US 2020/0212901 A1    Jul. 2, 2020

(30) Foreign Application Priority Data

Dec. 28, 2018    (TW) .............................. 107147726 A (51) Int. Cl.
*H03K 5/13* (2014.01)
*H03K 5/135* (2006.01)
(Continued)

(52) U.S. Cl.
CPC ............. *H03K 5/135* (2013.01); *H03K 5/133* (2013.01); *H03K 2005/00019* (2013.01)

(58) Field of Classification Search
CPC .................. H03K 5/135; H03K 5/133; H03K 2005/00019
(Continued)

(56) References Cited

U.S. PATENT DOCUMENTS

| 4,233,525 | A | 11/1980 | Takahashi et al. |
| 6,185,706 | B1 * | 2/2001 | Sugasawara ....... G01R 31/3016 |
| | | | 714/724 |

(Continued)

FOREIGN PATENT DOCUMENTS

| TW | 201434050 | 9/2014 |
| TW | 201710832 | 3/2017 |

OTHER PUBLICATIONS

Taiwan Intellectual Property Office, OA letter of counterpart TW application of application No. 107147726 dated Aug. 15, 2019. English summary on p. 1.

(Continued)

*Primary Examiner* — Ryan Jager
(74) *Attorney, Agent, or Firm* — WPAT, PC (57) ABSTRACT

Disclosed is a measuring circuit for quantizing variations in the operating speed of a target circuit. The measuring circuit includes: a signal generator configured to generate a predetermined signal; an adjustable delay circuit configured to generate a first and second delay signals according to the predetermined signal respectively; a signal detector configured to detect the first and second delay signals respectively and thereby generate a first and second detection results respectively; and a calibrating circuit configured to enable a first and second numbers of delay units of the adjustable delay circuit according to the first and second detection results respectively so as to make each of the delays respectively caused by the first and second numbers of delay units be less than a delay threshold, in which the first and second numbers relate to the operating speed of the target circuit operating in the first and second conditions respectively.

20 Claims, 9 Drawing Sheets

(51) Int. Cl.
*H03K 5/133* (2014.01)
*H03K 5/00* (2006.01)

(58) Field of Classification Search
USPC .......................................................... 327/276
See application file for complete search history.

(56) References Cited

U.S. PATENT DOCUMENTS

| | | | |
|---|---|---|---|
| 6,658,632 B1* | 12/2003 | Parulkar | G01R 31/318541 |
| | | | 716/101 |
| 6,701,476 B2* | 3/2004 | Pouya | G01R 31/318385 |
| | | | 714/727 |
| 8,248,136 B1 | 8/2012 | Zhang et al. | |
| 9,772,670 B2 | 9/2017 | Yu et al. | |
| 2004/0257723 A1 | 12/2004 | Naffziger | |
| 2008/0115019 A1* | 5/2008 | Ngo | G01R 31/31725 |
| | | | 714/724 |
| 2014/0237302 A1* | 8/2014 | Berry, Jr. | G06F 11/3409 |
| | | | 714/47.1 |
| 2014/0244947 A1 | 8/2014 | Song | |
| 2014/0266357 A1* | 9/2014 | Srinivas | H03K 5/159 |
| | | | 327/161 |
| 2017/0060221 A1 | 3/2017 | Yu et al. | |
| 2017/0301381 A1 | 10/2017 | Seomun et al. | |

OTHER PUBLICATIONS

OA letter of U.S. Appl. No. 16/573,136 dated Jan. 16, 2020.

* cited by examiner

S810 — in a first-designated operating condition, outputting a calibration signal to the adjustable delay circuit to adjust the adjustable delay circuit and have the delay contribution of the adjustable delay circuit be equal to a predetermined delay, in which when the delay contribution is equal to the predetermined delay, the value of the calibration signal is a first value related to a first number of delay component(s) in the adjustable delay circuit

Fig. 8

Fig. 9

MEASURING CIRCUIT FOR QUANTIZING VARIATIONS IN CIRCUIT OPERATING SPEED

BACKGROUND OF THE INVENTION

1. Field of the Invention

The present invention relates to a measuring circuit, especially to a measuring circuit capable of quantizing the variation in the operating speed of a circuit.

2. Description of Related Art

The operating speed of an integrated circuit (IC) is dependent on the length of a critical path of the IC; in other words, it is dependent on the degree of signal transmission delay caused by the critical path. The critical path is subject to the manufacturing process, voltage, temperature, aging status, and the like of the IC, in which the manufacturing process of the IC is known and invariable, the voltage is affected by the environmental condition (e.g., an unstable external power source) and the usage/condition of the IC (e.g., the IC or a device including the IC executing a specific application program; or the IR drop of the IC) and thereby varies with time, the temperature is affected by the environmental condition (e.g., the weather) and the usage/condition of the IC (e.g., the IC or a device including the IC executing a specific application program; or the IC power) and thereby varies with time, and the aging status is dependent upon the remaining life of the IC.

In light of the above, the operating speed of the IC varies with time due to the composite influence of the manufacturing process, voltage, temperature, and aging status (PVTA). The optimum performance of the IC may be achieved if the variation of the operating speed of the IC is well monitored and used for adjusting the IC. Since the operating speed of the IC is proportional to the upper limit of the operating clock allowing the IC to operate normally, the higher the operating speed, the higher the upper limit.

Several techniques capable of measuring the operating speed of an IC are listed below:

(1) Ring oscillator. This technique can estimate the operating speed of an IC by monitoring the operating speed of a ring oscillator, but the problems are slow response and impossible to measure the voltage variation within a short period of time.

(2) Voltage meter/temperature meter. This technique measures the voltage/temperature of the internal part of an IC to estimate the operating speed of the IC, but the problems are consuming a lot of circuit area, requiring conversion of the result of measurement to obtain the operating speed of the IC, and slow response.

(3) Critical path monitoring. This technique measures the signal delay caused by the critical path of an IC to estimate the operating speed of the IC, but the problems are complicated design flow because the critical path is usually uncertain till the late stage of the design of the IC, hard to find out the dominant critical path because different critical paths of the IC are dominant in different environmental conditions respectively, and impossible to monitor all of the critical paths.

(4) Pre-error detecting. This technique connects the critical path of an IC with an additional delay circuit in series and detects the output of the delay circuit; when the output of the delay circuit indicates that the signal delay gets longer and longer, it shows that the operating speed of the IC trends down and the IC may operate abnormally with the current operating clock in no time. This technique has the following problems: consuming a lot of circuit area; and the delay caused by the critical path becoming longer due to the influence of the additional delay circuit.

In addition to measuring the operating speed of a circuit, this technical filed also needs a technique capable of quantizing the operating speed of the circuit for utilization.

SUMMARY OF THE INVENTION

An object of the present invention is to provide a measuring circuit capable of measuring the variation in the operating speed of a target circuit operating in different operating conditions.

An embodiment of the measuring circuit of the present invention includes a signal generator, an adjustable delay circuit, a signal detector, and a calibrating circuit. The signal generator is configured to generate a predetermined signal. The adjustable delay circuit is configured to generate a first delay signal according to the predetermined signal in a first operating condition and generate a second delay signal according to the predetermined signal in a second operating condition. The signal detector is configured to detect the first delay signal and thereby generate a first detection result, and the signal detector is also configured to detect the second delay signal and thereby generate a second detection result. The calibrating circuit is configured to enable a first number of delay units of the adjustable delay circuit according to the first detection result and thereby limit the maximum delay caused by the first number of delay units of the adjustable delay circuit to a delay threshold, and the calibrating circuit is also configured to enable a second number of delay units of the adjustable delay circuit according to the second detection result and thereby limit the maximum delay caused by the second number of delay units of the adjustable delay circuit to the delay threshold, wherein the first number of delay units of the adjustable delay circuit relates to the operating speed of the target circuit operating in the first operating condition, and the second number of delay units of the adjustable delay circuit relates to the operating speed of the target circuit operating in the second operating condition.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present invention discloses a measuring circuit capable of quantizing the variation in the operating speed of a target circuit operating in different operating conditions. The measuring circuit includes a circuit operating speed detecting circuit and a calibrating circuit that are described in the following paragraphs respectively.

Figure 1:
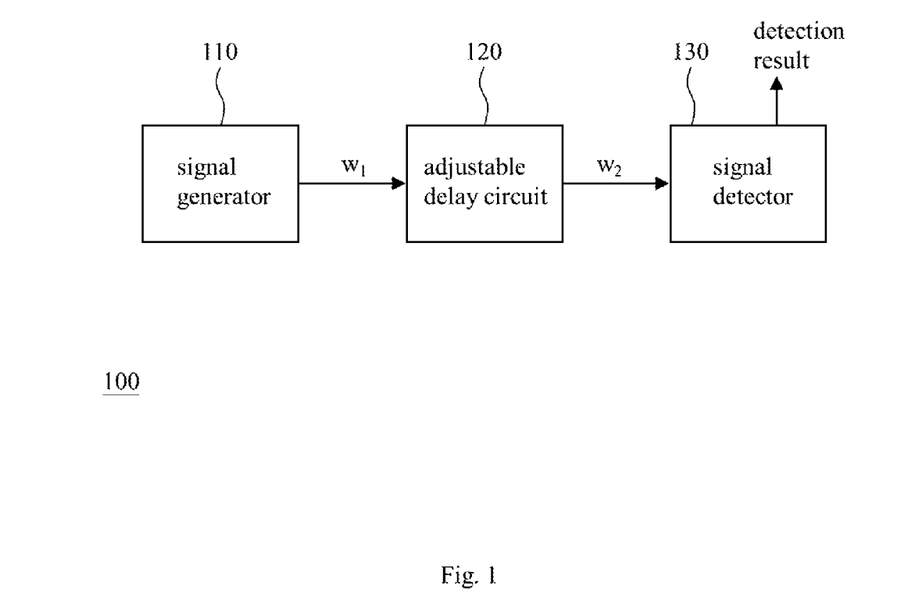
FIG. 1 shows an embodiment of the circuit operating speed detecting circuit of the present disclosure.

FIG. 1 shows an embodiment of the circuit operating speed detecting circuit of the present disclosure. The circuit operating speed detecting circuit 100 of FIG. 1 is configured to detect the operating speed of a target circuit (not shown) by detecting the effective delay of an adjustable delay circuit during a monitor mode while the target circuit is configured to operate according to a reference clock. The circuit operating speed detecting circuit 100 and the target circuit are optionally included in the same integrated circuit, and the circuit operating speed detecting circuit 100 is a digital circuit, but not limited thereto. The circuit operating speed detecting circuit 100 includes a signal generator 110, an adjustable delay circuit 120, and a signal detector 130; the details of these circuits are described in the later paragraphs.

Please refer to FIG. 1. During the monitor mode, the signal generator 110 generates a predetermined signal $w_1$ (e.g., a signal including a rising edge, or a pulse signal) in a current operating condition which relates to at least one of the following factors: the manufacturing process of the target circuit; the current operating voltage of the target circuit; the current temperature of the target circuit; and the current aging status of the target circuit. Since the voltage, temperature, and aging status vary with time, the current operating condition varies with time.

Please refer to FIG. 1. The adjustable delay circuit 120 is coupled between the signal generator 110 and the signal detector 130. During the monitor mode, the adjustable delay circuit 120 generates a delay signal $w_2$ according to the predetermined signal $w_1$ in the current operating condition. It should be noted that the delay caused by the adjustable delay circuit 120 in a default operating condition (e.g., the worst/worse operating condition (such as the lowest/lower voltage condition) allowing the target circuit to operate normally) could be preset, given by a user, or determined during a calibration mode that is described in the later paragraph; in addition, both the transmission delay characteristic of the adjustable delay circuit 120 and the transmission delay characteristic of the target circuit vary with the current operating condition which varies with time. In an exemplary implementation, the adjustable delay circuit 120 has no need to connect with any critical path of the target circuit because the transmission delay of the critical path can be estimated by detecting the delay signal $w_2$ of the adjustable delay circuit 120, which implies that the circuit operating speed detecting circuit 100 has no need to find out and connect with any critical path of the target circuit for detection; consequently, the design of the circuit operating speed detecting circuit 100 is simplified and easy to be implemented. In order to ensure that the trend of the transmission delay characteristic of the adjustable delay circuit 120 is linearly/nonlinearly proportional to the trend of the transmission delay characteristic of the target circuit, the design of the adjustable delay circuit 120 can be realized in at least one of the following ways: having at least some basic component(s) (e.g., standard MOS transistor(s)) of the adjustable delay circuit 120 be identical/similar to at least some basic component(s) of the target circuit; designing the adjustable delay circuit 120 according to the simulation result of the transmission delay characteristic of at least one critical path of the target circuit; and designing the adjustable delay circuit 120 according to known transmission delay characteristics (e.g., transmission delay characteristics of critical paths) of a circuit (e.g., an old version of the target circuit) identical/similar to the target circuit.

Please refer to FIG. 1. During the monitor mode, the signal detector 130 detects the degree of delay of the delay signal $w_2$ in the current operating condition and thereby generates a detection result. More specifically, the signal detector 130 generates the detection result being a first result if the degree of delay is not greater than a predetermined threshold, and generates the detection result being a second result if the degree of delay is greater than the predetermined threshold, wherein each of the first and second results is related to the operating speed of the target circuit. In detail, the first result indicates that the target circuit can operate normally with an enough margin in the current operating condition and the second result indicates that the target circuit may not operate normally once the current operating condition is getting worse; accordingly, the maximum workable operating speed of the target circuit in connection with the first result is higher than the maximum workable operating speed of the target circuit in connection with the second result. Each of the first and second results can be used for adjusting the operation of the target circuit; for instance, when the target circuit operates in the current operating condition, if the signal detector 130 generates the first result, this can be used as an indication of maintaining or increasing the frequency of the reference clock for better performance, and if the signal detector 130 generates the second result, this can be used as an indication of decreasing the frequency of the reference clock for safe operation. Besides, the predetermined threshold can be determined according to the cycle of the reference clock; for instance, the predetermined threshold is equal to the cycle of the reference clock.

Figure 2:
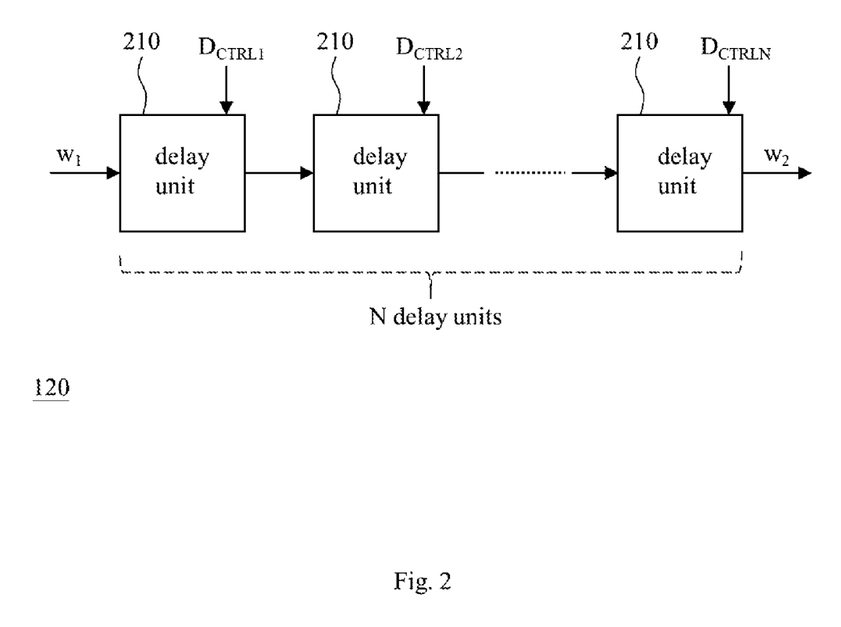
FIG. 2 shows an embodiment of the adjustable delay circuit of FIG. 1.

FIG. 2 shows an embodiment of the adjustable delay circuit 120 of FIG. 1. As shown in FIG. 2, the adjustable delay circuit 120 includes N delay units 210 that are connected in series; these delay units 210 can be identical or different according to the demand for implementation. The adjustable delay circuit 120 enables M delay unit(s) 210 among the N delay units 210 according to N control signals ($D_{CTRL1} \sim D_{CTRLN}$) so as to delay the predetermined signal $w_1$ and thereby generate the delay signal $w_2$, in which the N is an integer greater than one and the M is a positive integer not greater than the N. In brief, the adjustable delay circuit 120 enables some or all of the N delay units 210 according to the N control signals ($D_{CTRL1} \sim D_{CTRLN}$) to generate the delay signal $w_2$. In an exemplary implementation, a first delay unit and a second delay unit of the N delay units 210 are different so that the maximum delay caused by the first delay unit is different from the maximum delay caused by the second delay unit in the same condition; for instance, the number of standard delay components included in the first delay unit is different from the number of the standard delay components included in the second delay unit, and thus the maximum delays respectively caused by the first and second delay units are different. In another exemplary implementation, the N delay units 210 are divided into a first delay unit group (including X delay unit(s), in which the X is a positive integer) and a second delay unit group (including Y delay unit(s), in which the Y is a positive integer); the first delay unit group is used for adjusting the predetermined signal $w_1$ roughly and thereby outputting a first delay signal to the second delay unit group, and the second delay unit group is used for adjusting the first delay signal finely and thereby outputting the delay signal $w_2$; the maximum delays respectively caused by any two delay units among the first/second delay unit group can be the same or different. In yet another exemplary implementation, the aforementioned second delay unit group is composed of a plurality of delay unit sets connected in parallel; each of the delay unit sets is designed to realize a transmission delay characteristic, and one of the delay unit sets is used for generating the delay signal $w_2$.

Figure 3:
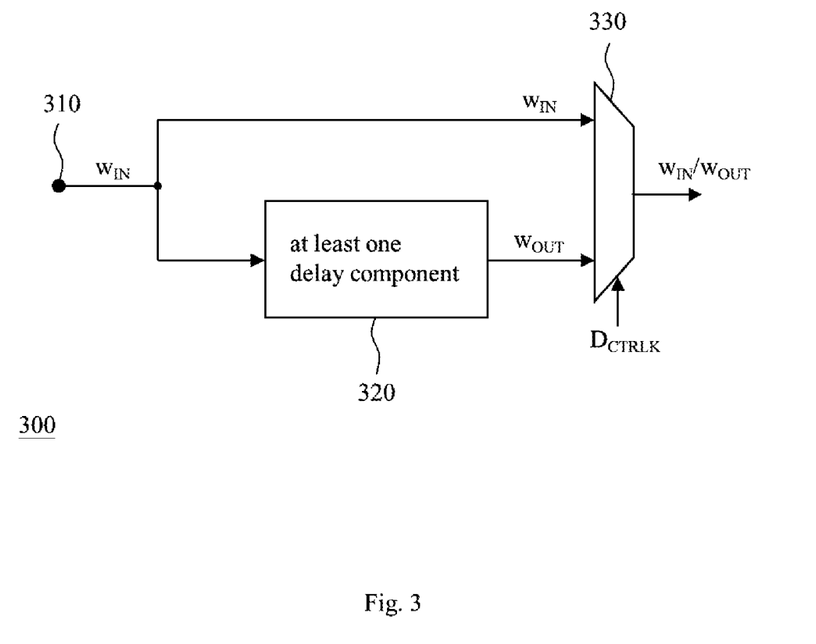
FIG. 3 shows an embodiment of each delay unit of FIG. 2.

FIG. 3 shows a delay unit 300 which is an embodiment of each delay unit 210 of FIG. 2. The delay unit 300 includes an input terminal 310, at least one delay component 320, and a multiplexer 330. The input terminal 310 is configured to receive an input signal $w_{IN}$ that is the predetermined signal $w_1$ or the delay version thereof. The at least one delay component 320 is configured to generate an output signal $w_{OUT}$ by delaying the input signal $w_{IN}$. When the at least one delay component 320 includes a plurality of delay components (e.g., known or self-developed delay components), these delay components can optionally be connected in series according to the demand for implementation. The multiplexer 330 is coupled to the input terminal 310 and the at least one delay component 320, and configured to output one of the input signal $w_{IN}$ and the delayed output signal $w_{OUT}$ according to a control signal ($D_{CTRLK}$) of the aforementioned N control signals. In light of the above, by controlling the multiplexer 330 with the control signal $D_{CTRLK}$, each of the N delay units 210 can contribute delay or no delay, and thus the delay between the predetermined signal $w_1$ and the delay signal $w_2$ as shown in FIG. 2. can be set in the default operating condition (e.g., the worst/worse operating condition allowing the target circuit to operate normally).

Figure 4:
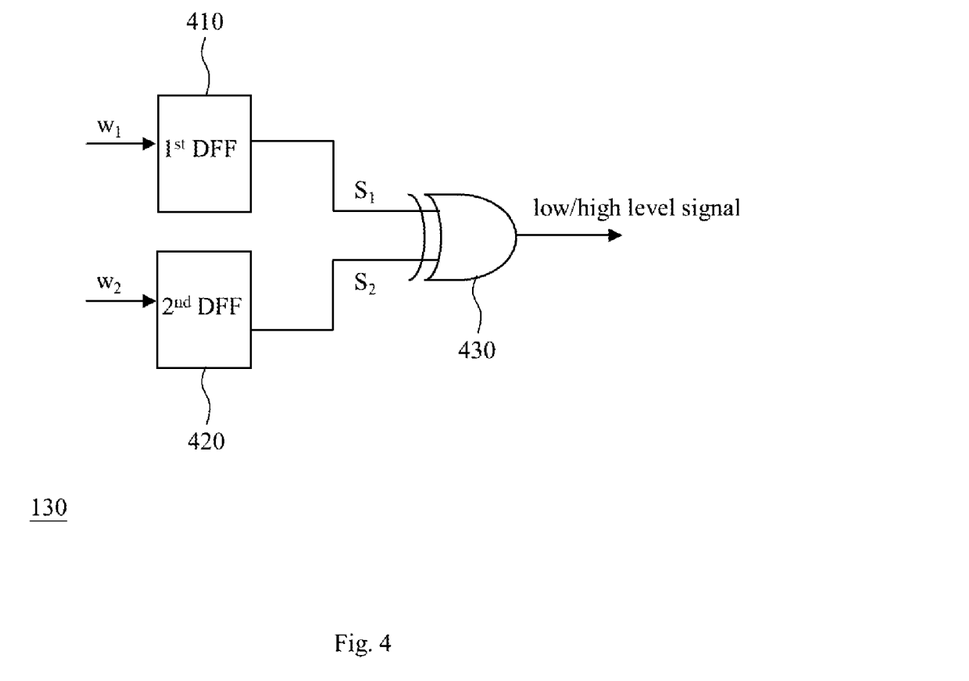
FIG. 4 shows an embodiment of the signal detector of FIG. 1.

FIG. 4 shows an embodiment of the signal detector 130 of FIG. 1. This embodiment is suitable for detecting the delay signal $w_2$ generated by the adjustable delay circuit 120 of FIG. 2. As shown in FIG. 4, the signal detector 130 includes a first D-type flip flop ($1^{st}$ DFF) 410, a second D-type flip flop ($2^{nd}$ DFF) 420, and an Exclusive-Or gate (XOR gate). The first DFF 410 and the second DFF 420 are configured to sample the predetermined signal $w_1$ and the delay signal $w_2$ at the same time respectively and thereby output two sample results $S_1$, $S_2$. The XOR gate 430 is configured to determine whether the degree of delay of the delay signal $w_2$ is greater than the predetermined threshold according to the relation between the two sample results $S_1$, $S_2$; more specifically, when the two sample results $S_1$, $S_2$ are the same, the XOR gate 430 outputs a low level signal indicating that the degree of delay of the delay signal $w_2$ is not greater than the predetermined threshold, and when the two sample results $S_1$, $S_2$ are different, the XOR gate 430 outputs a high level signal indicating that the degree of delay of the delay signal $w_2$ is greater than the predetermined threshold.

Figure 5:
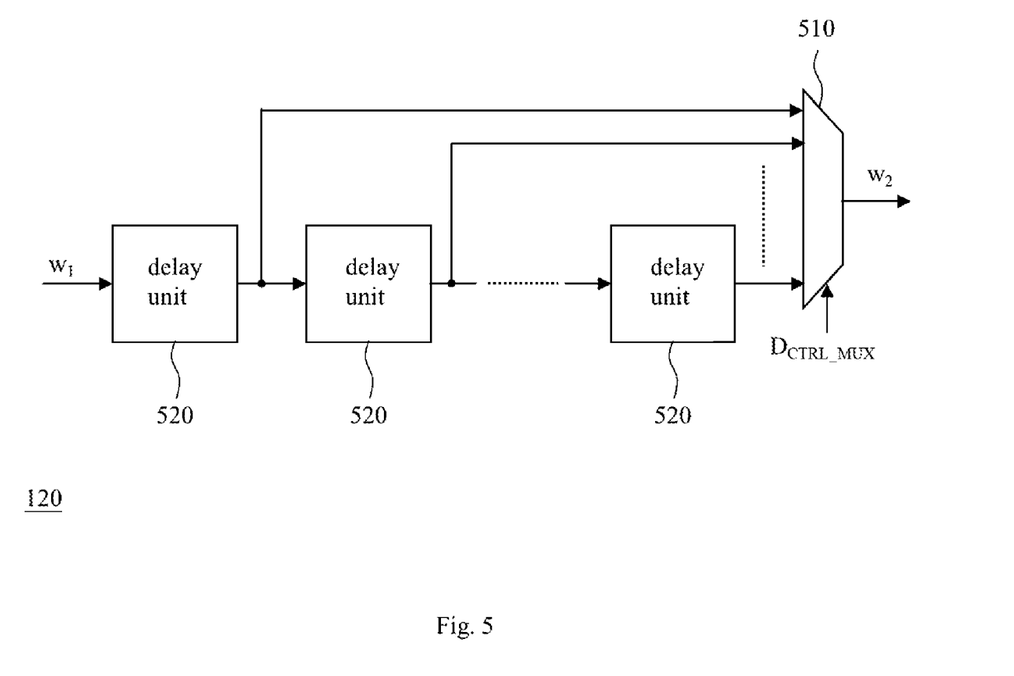
FIG. 5 shows another embodiment of the adjustable delay circuit of FIG. 1.

FIG. 5 shows another embodiment of the adjustable delay circuit 120 of FIG. 1. The major difference between the embodiment of FIG. 5 and the embodiment of FIG. 2 is that the embodiment of FIG. 5 includes a multiplexer 510 and the delay units 520 of FIG. 5 could be different from the delay units 210 of FIG. 2. The multiplexer 510 is configured to receive the output signal of each of the N delay units 520 and then output one of the N output signals as the delay signal $w_2$ according to a control signal $D_{CTRL\_MUX}$. It should be noted that the feature of the embodiment of FIG. 2 can be applied to the embodiment of FIG. 5 as long as such application is reasonable and practicable.

Figure 6:
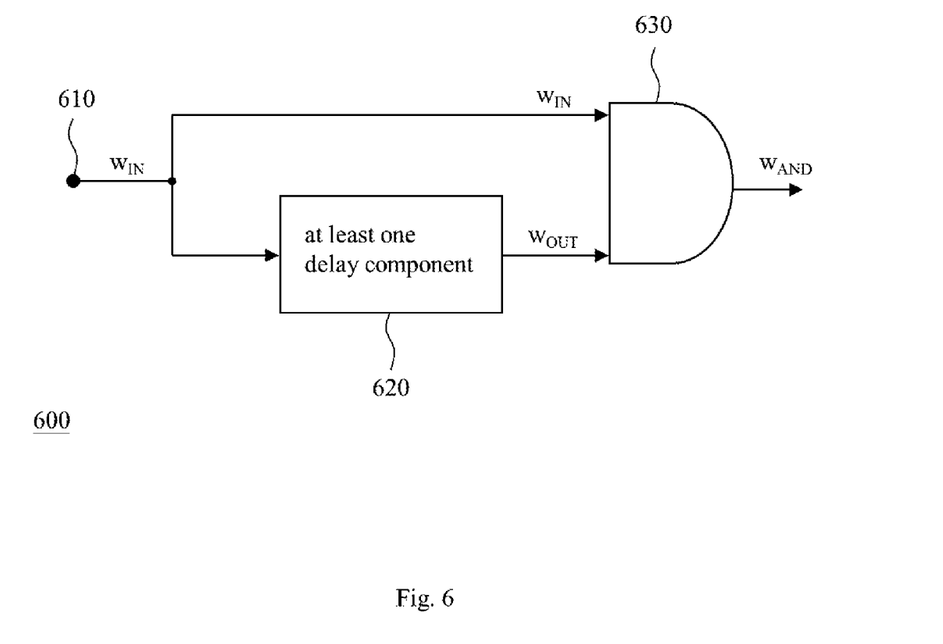
FIG. 6 shows an embodiment of each delay unit of FIG. 5.

FIG. 6 shows a delay unit 600 which is an embodiment of each delay unit 520 of FIG. 5. The delay unit 600 includes an input terminal 610, at least one delay component 620, and an AND gate 630. The input terminal 610 is configured to receive an input signal $w_{IN}$ that is the predetermined signal $w_1$ or the delay version thereof. Compared with the predetermined signal $w_1$, the delay version of $w_1$ could be distorted; for instance, the predetermined signal $w_1$ is a pulse signal having a pulse width wider than the pulse width of the delay version of $w_1$. The at least one delay component 620 is configured to generate an output signal $w_{OUT}$ by delaying the input signal $w_{IN}$. When the at least one delay component 620 includes a plurality of delay components, these delay components can optionally be connected in series according to the demand for implementation. The AND gate 630 is configured to output a logical conjunction result $w_{AND}$ of the input signal $w_{IN}$ and the delayed output signal $w_{OUT}$; for instance, providing the input signal $w_{IN}$ is a pulse signal, since the output signal $w_{OUT}$ is the delay version of the input signal $w_{IN}$, the logical conjunction result $w_{AND}$ is a narrower pulse signal or a low level signal in accordance with the duration of the input signal $w_{IN}$ and the output signal $w_{OUT}$ being at the high level concurrently. In light of the above, the control signal $D_{CTRL\_MUX}$ selects one of the N output signals $w_{OUT}$ as the delay signal $w_2$ so as to determine the delay between the predetermined signal $w_1$ and the delay signal $w_2$ in the default operating condition (e.g., the worst/worse operating condition allowing the target circuit to operate normally). It should be noted that when the predetermined signal $w_1$ is a pulse signal, the narrower the pulse width of the delay signal $w_2$, the greater the degree of delay of the delay signal $w_2$; if the pulse width of the delay signal $w_2$ is 0, it implies that the degree of delay of the delay signal $w_2$ reaches or exceeds the aforementioned predetermined threshold. It should also be noted that in order to measure the pulse width of the output signal of the multiplexer 510, the signal detector 130 of FIG. 1 can incorporate a known pulse width measuring circuit (e.g., a counter) to realize the measurement of pulse width.

Figure 7:
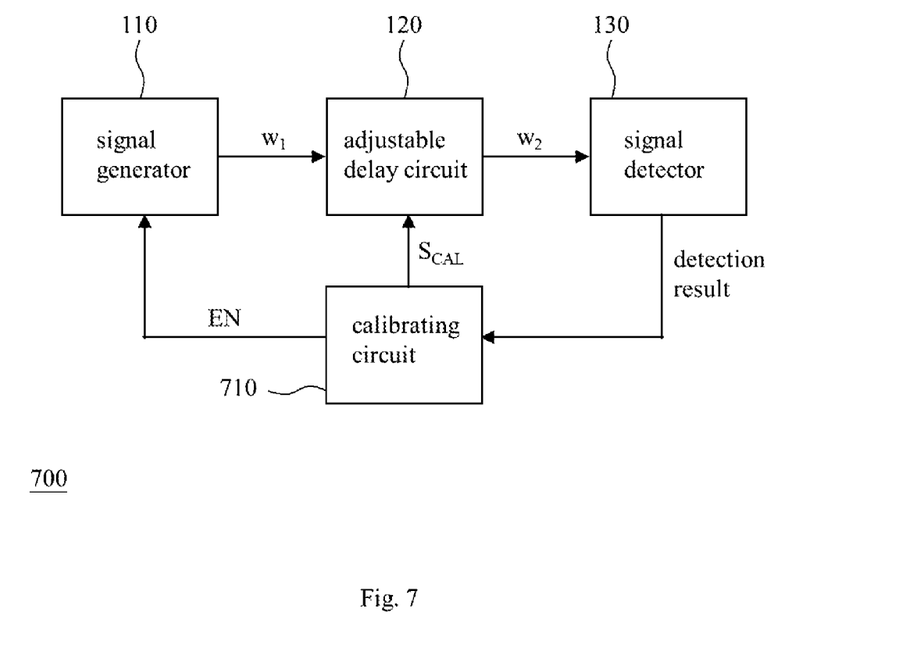
FIG. 7 shows an embodiment of the measuring circuit of the present invention.
Figure 8:
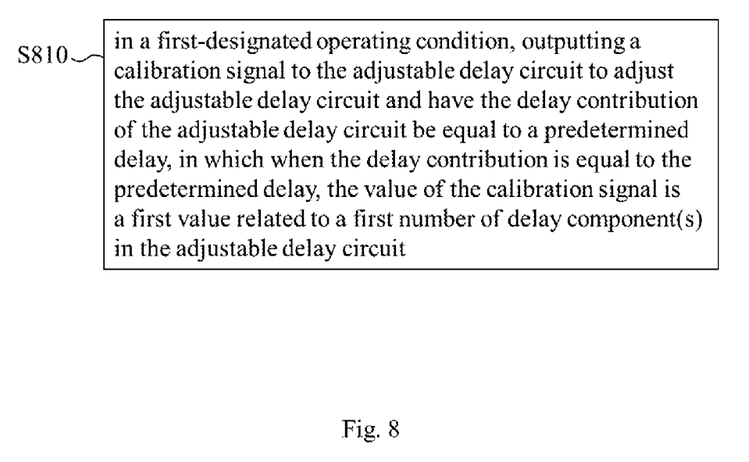
FIG. 8 shows the step executed by the calibrating circuit of FIG. 7.

FIG. 7 shows an embodiment of the measuring circuit of the present invention capable of quantizing the variation in the operating speed of the target circuit. The measuring circuit 700 of FIG. 7 includes the aforementioned circuit operating speed detecting circuit 100 and a calibrating circuit 710. The measuring circuit 700 can not only operate in the aforementioned monitor mode but also find out the relation between an operating condition of the target circuit and a corresponding delay caused by the adjustable delay circuit 120 in a calibration mode. This relation can be used for setting the adjustable delay circuit 120 by a user or circuit operating speed detecting circuit. The calibrating circuit 710 is configured to execute at least the following step (as shown in FIG. 8) in a calibration mode:

step S810: In a first-designated operating condition such as the lowest voltage condition allowing the target circuit to operate normally, outputting a calibration signal $S_{CAL}$ to the adjustable delay circuit 120 to adjust the adjustable delay circuit 120 and thereby have the delay contribution of the adjustable delay circuit 120 be equal to a predetermined delay (e.g., the cycle of the aforementioned reference clock), in which when the delay contribution is equal to the predetermined delay, the value of the calibration signal $S_{CAL}$ is a first value, and a first number of delay component(s) in the adjustable delay circuit 120 which could be composed of the aforementioned N delay units 210/510 is enabled to delay the predetermined signal $w_1$. An instance of the lowest voltage condition is that the switching speed of the NMOS and PMOS transistors of the target circuit is typical, the operating voltage is 0.9V, the temperature is 25□, and the aging status has not reached a predetermined aging status.

It should be noted that during the monitor mode, the first-designated operating condition is treated as a warning operating condition of the target circuit, and the adjustable delay circuit 120 is set in accordance with the first value of the calibration signal $S_{CAL}$ that is dependent upon the first-designated operating condition. Additionally, during the calibration mode, in a second-designated operating condition such as a normal voltage condition (e.g., a condition that the switching speed of the NMOS and PMOS transistors of the target circuit is typical, the operating voltage is 1V, the temperature is 25□, and the aging status has not reached a predetermined aging status) allowing the target circuit to operate normally, the calibration signal $S_{CAL}$ is outputted to the adjustable delay circuit 120 to adjust the adjustable delay circuit 120 and thereby have the delay contribution of the adjustable delay circuit 120 be equal to the predetermined delay (e.g., the cycle of the aforementioned reference clock), in which when the delay contribution is equal to the predetermined delay, the value of the calibration signal $S_{CAL}$ is a second value, and a second number of delay components of the adjustable delay circuit 120 which could be composed of the aforementioned N delay units 210/510 is enabled to delay the predetermined signal $w_1$. The second number of delay components is more than the aforementioned first number of delay component(s) because a delay caused by an enabled delay component in the normal voltage condition is less than the delay caused by an enabled delay component in the lowest voltage condition. The difference between the second number of delay components and the first number of delay component(s) indicates the change of transmission delay of the adjustable delay circuit 120 from the normal voltage condition to the lowest voltage condition.

In light of the above, during the monitor mode, the delay contribution of the adjustable delay circuit 120 which is initially set in accordance with the first value of the calibration signal $S_{CAL}$ won't reach the predetermined delay in a normal operating condition (i.e., the second-designated operating condition). When the current operating condition of the target circuit is getting worse and reaches the warning operating condition (i.e., the first-designated operating condition), the delay contribution of the adjustable delay circuit 120 will reach the predetermined delay (while the degree of delay of the delay signal $w_2$ reaches the aforementioned predetermined threshold). If the current operating condition keeps getting worse (e.g., the aforementioned operating voltage keeps going down), the target circuit may not operate normally. Therefore, when the signal detector 130 finds that the degree of delay of the delay signal $w_2$ reaches/exceeds the predetermined threshold, the signal detector 130 can optionally issue a warning signal according to the demand for implementation so that a circuit or user receiving the warning signal can lower the frequency of the aforementioned reference clock for the target circuit to ensure that the target circuit can operate normally in accordance with the lower frequency. It should be noted that during the calibration mode, the calibrating circuit 710 can output the calibration signal $S_{CAL}$ to the adjustable delay circuit 120 according to the detection result generated by the signal detector 130 every round in an operating condition and thereby use the increasing values of the calibration signal $S_{CAL}$ to gradually increase the delay contribution of the adjustable delay circuit 120 until the detection result changes from the first result to the second result; the setting of the adjustable delay circuit 120 corresponding to the change of the detection result stands for the relation between the operating condition and the value of the calibration signal $S_{CAL}$. When outputting the calibration signal $S_{CAL}$, the calibrating circuit 710 may output an enabling signal EN simultaneously to enable the signal generator 110 so that the signal generator 100 generates the predetermined signal $w_1$ for the next round of detection.

The measuring circuit 700 of FIG. 7 is operable to measure the variation in the operating speed of the target circuit operating in different operating conditions. Please refer to FIG. 7. In an exemplary implementation, the signal generator 110 is used for generating a predetermined signal (e.g., the aforementioned signal $w_1$); the adjustable delay circuit 120 is used for generating a first delay signal (e.g., the aforementioned signal $w_2$ in the below-mentioned first operating condition) according to the predetermined signal in a first operating condition (e.g., a condition that the load/utilization rate of the target circuit is below a threshold, or a condition that the target circuit operates with a first parametric setting including a higher supply voltage and/or a lower clock frequency for the target circuit), and the adjustable delay circuit 120 is also used for generating a second delay signal (e.g., the aforementioned signal $w_2$ in the below-mentioned second operating condition) according to the predetermined signal in a second operating condition (e.g., a condition that the load/utilization rate of the target circuit is higher a threshold, or a condition that the target circuit operates with a second parametric setting including a lower supply voltage and/or a higher clock frequency for the target circuit). Furthermore, the signal detector 130 is used for generating a first detection result by detecting the first delay signal in the first operating condition and generating a second detection result by detecting the second delay signal in the second operating condition. In addition, the calibrating circuit 710 is capable of enabling a first number of delay units of the adjustable delay circuit 120 according to the first detection result in the first operating condition so as to limit the maximum delay caused by the first number of delay units to a delay threshold (e.g., the aforementioned predetermined threshold, or the predetermined threshold plus/minus the maximum delay caused by one or more delay units of the adjustable delay circuit 120); in other words, the maximum delay caused by the first number of delay units plus the delay caused by another delay unit will exceed the delay threshold. Moreover, the calibrating circuit 710 is also capable of enabling a second number of delay units of the adjustable delay circuit 120 according to the second detection result in the second operating condition so as to limit the maximum delay caused by the second number of delay units to the delay threshold; in other words, the maximum delay caused by the second number of delay units plus the delay caused by another delay unit will exceed the delay threshold. The first number of delay units relates to the operating speed of the target circuit operating in the first operating condition, and the second number of delay units relates to the operating speed of the target circuit operating in the second operating condition.

In an exemplary implementation, the value of the calibration signal $S_{CAL}$ obtained with the step S810 is 16 in the first operating condition and this value of the calibration signal $S_{CAL}$ stands for the first number of delay units mentioned in the preceding paragraph; furthermore, the value of the calibration signal $S_{CAL}$ obtained with the step S810 is 14 in the second operating condition and this value of the calibration signal $S_{CAL}$ stands for the second number of delay units mentioned in the preceding paragraph; therefore the calibrating circuit 710 can estimate the trend of the operating speed of the target circuit from the first operating condition to the second operating condition according to the variation in the values of the calibration signal $S_{CAL}$, and quantize the change of the operating speed of the target circuit from the first operating condition to the second operating condition in accordance with the difference between the first number of delay units and the second number of delay units.

In light of the above, since the variation in circuit operating parameters can be treated as the variation in circuit operating conditions, the calibrating circuit 710 can quantize the variation in the operating speed of the target circuit varying with different setting of circuit operating parameters. For instance, P parametric values of a controllable parameter (e.g., a parameter related to an operating voltage of the target circuit and/or to the frequency of a reference clock of the target circuit) stand for P operating conditions respectively, the calibrating circuit 710 obtains P calibration signals in the P operating conditions respectively, and the P calibration signals stand for P kinds of delays of the adjustable delay circuit 120, that is to say P kinds of numbers of delay units of the adjustable delay circuit 120, wherein the P is an integer greater than one. Please refer to table 1 below; in an exemplary implementation, the controllable parameter is a voltage, the P parametric values are decreasing voltage values 1, 0.98. . . . , 0.88, and 0.86, the P calibration signals, that are equivalent to numbers of enabled delay units, corresponding to the P parametric values are 16, 15, . . . , 10, and 9, and thus table 1 shows the relation between the voltage and the delay caused by the adjustable delay circuit 120. In an exemplary implementation, the values of the P calibration signals include the aforementioned first number of delay units (e.g., sixteen) and second number of delay units (e.g., fourteen) and therefore the voltage trend of FIG. 1 is related to the trend of the operating speed of the target circuit from the first operating condition to the second operating condition. It should be noted that an interpolation technique can be used for expanding table 1.

TABLE 1

| | voltage values | | | | | | | |
|---|---|---|---|---|---|---|---|---|
| | 1.00 | 0.98 | 0.96 | 0.94 | 0.92 | 0.90 | 0.88 | 0.86 |
| number of enabled delay units | 16 | 15 | 14 | 13 | 12 | 11 | 10 | 9 |

Figure 9:
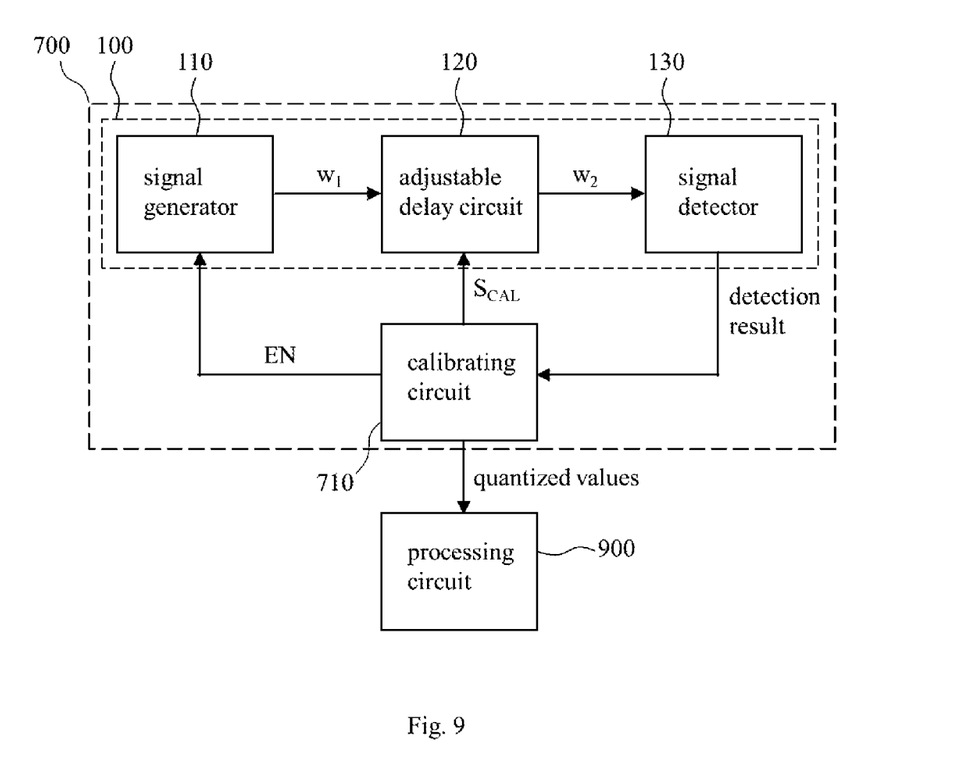
FIG. 9 shows the measuring circuit of FIG. 7 outputting quantized values to a processing circuit for utilization.

In light of the above, the calibrating circuit 710 can output P quantized values (e.g., the binary values of the P kinds of numbers of delay units) to other circuits for utilization in accordance with the P kinds of numbers of delay units (e.g., the numbers of enabled delay units in table 1). In an exemplary implementation, the calibration circuit outputs the P quantized values to an external device (e.g., a user interface) via at least one output terminal (e.g., at least one I/O pad) according to the P kinds of numbers of delay units and thereby allows the external device to obtain the relation between the delay caused by the adjustable delay circuit 120 and the variation in the P parametric values (e.g., the voltage values in table 1) for utilization. In an exemplary implementation as shown in FIG. 9, the calibration circuit 710 outputs the P quantized values to a processing circuit 900 (e.g., a dynamic voltage frequency scaling controller, a host in combination with software and/or firmware, or a specific/general-purpose electronic device) according to the P kinds of numbers of delay units and thereby allows the processing circuit 900 to obtain the relation between the delay caused by the adjustable delay circuit 120 and the variation in the P parametric values, in which at least two of the measuring circuit 700, the target circuit, and the processing circuit 900 could optionally be included in the same integrated circuit according to the demand for implementation. In an exemplary implementation, the processing circuit 900 can adjust the controllable parameter (e.g., voltage or clock frequency) or a circuit operating parameter related to the controllable parameter in accordance with the relation between the delay caused by the adjustable delay circuit 120 and the variation in the P operating conditions, and thereby adjusts the operation of the target circuit. In an exemplary implementation, the target circuit goes through at least one event (e.g., the target circuit or a device including the target circuit executing a specific software program such as a multimedia player software program) in a period of time; the measuring circuit 700 generates Q quantized values in order (e.g., at 1 ms intervals) in the period of time as shown in table 2 below. Each of the Q quantized values is related to a certain number of delay units of the adjustable delay circuit 120 and the Q quantized values indicate the relation between the at least one event and the delay caused by the adjustable delay circuit 120, in which the Q is an integer greater than one. The calibrating circuit 710 outputs the Q quantized values to the processing circuit 900; since the processing circuit 900 has obtained the relation between the delay caused by the adjustable delay circuit 120 and the variation in the P parametric values according to the P quantized values, the processing circuit 900 can obtain the relation between the at least one event and the variation in the P parametric values according to the Q quantized values and the P quantized values as shown in table 3 below. Additionally, the processing circuit 900 can adjust the controllable parameter or a circuit operating parameter related to the controllable parameter according to the relation between the at least one event and the variation in the P parametric values and thereby adjust the operation of the target circuit or maintain the operating speed of the target circuit; for instance, the processing circuit 900 increases the supply voltage for the target circuit during the target circuit executing a specific software program and thereby ensures that the target circuit runs smoothly.

TABLE 2

| | \multicolumn{12}{c}{time (at 1 ms intervals)} | | | | | | | | | | | |
|---|---|---|---|---|---|---|---|---|---|---|---|---|---|
| | 1 | 2 | 3 | 4 | 5 | 6 | 7 | 8 | ... | 2000 | 2001 | 2002 | 2003 | 2004 |
| event | | starting executing specific program | | | | | | | | stopping executing specific program | | | | |
| number of enabled delay units | 16 | 16 | 12 | 10 | 10 | 11 | 11 | 11 | ... | 11 | 15 | 16 | 16 | 16 |

TABLE 3

| | 1 | 2 | 3 | 4 | 5 | 6 | 7 | 8 | ... | 2000 | 2001 | 2002 | 2003 | 2004 |
|---|---|---|---|---|---|---|---|---|---|---|---|---|---|---|
| | | | | | time (at 1 ms intervals) | | | | | | | | | |
| event | | starting executing specific program | | | | | | | | stopping executing specific program | | | | |
| voltage value | 1 | 1 | 0.92 | 0.88 | 0.88 | 0.9 | 0.9 | 0.9 | ... | 0.9 | 0.98 | 1 | 1 | 1 |

It should be noted that people of ordinary skill in the art can implement the present invention by selectively using some or all of the features of any embodiment in this specification or selectively using some or all of the features of multiple embodiments in this specification as long as such implementation is practicable, which implies that the present invention can be carried out flexibly.

To sum up, the present invention can quantize the variation in the operating speed of a target circuit operating in different operating conditions and thereby provide quantized values for utilization.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A measuring circuit for quantizing variation in operating speed of a target circuit operating in different operating conditions, the measuring circuit comprising:
   a signal generator configured to generate a predetermined signal;
   an adjustable delay circuit configured to generate a first delay signal according to the predetermined signal in a first operating condition and generate a second delay signal according to the predetermined signal in a second operating condition, in which the first operating condition is a condition of the target circuit executing a specific software program at a first time point and the second operating condition is a condition of the target circuit executing the specific software program at a second time point;
   a signal detector configured to detect the first delay signal and thereby generate a first detection result, and configured to detect the second delay signal and thereby generate a second detection result; and
   a calibrating circuit configured to enable a first number of delay units of the adjustable delay circuit according to the first detection result and thereby limit a delay caused by the first number of delay units of the adjustable delay circuit to a delay threshold, and the calibrating circuit configured to enable a second number of delay units of the adjustable delay circuit according to the second detection result and thereby limit a delay caused by the second number of delay units of the adjustable delay circuit to the delay threshold,
   wherein the first number of delay units of the adjustable delay circuit relates to the operating speed of the target circuit operating in the first operating condition, the second number of delay units of the adjustable delay circuit relates to the operating speed of the target circuit operating in the second operating condition, and the first number of delay units and the second number of delay units are jointly indicative of variation in a speed of the target circuit executing the specific software program.

2. The measuring circuit of claim 1, wherein the delay threshold relates to a cycle of a reference clock and the target circuit operates according to the reference clock.

3. The measuring circuit of claim 1, wherein P parametric values of a controllable parameter stand for P operating conditions respectively, the adjustable delay circuit generates P delay signals according to the predetermined signal in the P operating conditions respectively, the signal detector generates P detection results according to the P delay signals respectively, the calibrating circuit enables P kinds of numbers of delay units of the adjustable delay circuit according to the P detection results respectively, the P kinds of numbers of delay units of the adjustable delay circuit relate to the P parametric values respectively, and the P is an integer greater than one.

4. The measuring circuit of claim 3, wherein the P kinds of numbers of delay units of the adjustable delay circuit include the first number of delay units of the adjustable delay circuit and the second number of delay units of the adjustable delay circuit.

5. The measuring circuit of claim 3, wherein the calibrating circuit outputs P quantized values to a processing circuit according to the P kinds of numbers of delay units of the adjustable delay circuit and thereby allows the processing circuit to obtain a relation between a delay caused by the adjustable delay circuit and a variation in the P parametric values.

6. The measuring circuit of claim 5, wherein the processing circuit adjusts the controllable parameter or a circuit operating parameter related to the controllable parameter according to the relation between the delay caused by the adjustable delay circuit and the variation in the P parametric values and thereby adjusts an operation of the target circuit.

7. The measuring circuit of claim 5, wherein the target circuit goes through at least one event in a period of time, the measuring circuit generates Q quantized values in the period of time, the Q quantized values indicate a relation between the at least one event and the delay caused by the adjustable delay circuit, the processing circuit obtains a relation between the at least one event and the variation in the P parametric values according to the Q quantized values and the P quantized values, and the Q is an integer greater than one.

8. The measuring circuit of claim 7, wherein the processing circuit adjusts the controllable parameter or a circuit operating parameter related to the controllable parameter according to the relation between the at least one event and the variation in the P parametric values and thereby adjusts an operation of the target circuit.

9. The measuring circuit of claim 5, wherein at least two of the measuring circuit, the target circuit, and the processing circuit are included in an integrated circuit.

10. The measuring circuit of claim 3, wherein the controllable parameter relates to at least one of an operating voltage of the target circuit and a frequency of a reference clock of the target circuit.

11. The measuring circuit of claim 1, wherein the measuring circuit is a digital circuit.

12. The measuring circuit of claim 1, wherein both a transmission delay characteristic of the adjustable delay circuit and a transmission delay characteristic of the target circuit vary with each of the first operating condition and the second operating condition, and a trend of the transmission delay characteristic of the adjustable delay circuit is proportional to a trend of the transmission delay characteristic of the target circuit.

13. The measuring circuit of claim 1, wherein the adjustable delay circuit includes N delay units connected in series, the adjustable delay circuit enables X delay unit(s) among the N delay units according to N control signals and thereby generates the first delay signal, the adjustable delay circuit enables Y delay unit(s) among the N delay units according to the N control signals and thereby generates the second delay signal, the N is an integer greater than one, and each of the X and the Y is a positive integer not greater than the N.

14. The measuring circuit of claim 13, wherein each of the N delay units includes:
an input terminal configured to receive an input signal that is the predetermined signal or a delay version of the predetermined signal;
at least one delay component configured to generate an output signal by delaying the input signal; and
a multiplexer configured to output one of the input signal and the output signal according to one of the N control signals.

15. The measuring circuit of claim 14, wherein the signal detector is used for sampling the predetermined signal and the first delay signal concurrently to obtain a first signal relation and thereby generating the first detection result according to the first signal relation; and the signal detector is also used for sampling the predetermined signal and the second delay signal concurrently to obtain a second signal relation and thereby generating the second detection result according to the second signal relation.

16. The measuring circuit of claim 1, wherein the adjustable delay circuit includes N delay units and a multiplexer; the N delay units are connected in series and configured to output N output signals respectively; and the multiplexer is configured to receive each of the N output signals of the N delay units and then output one of the N output signals of the N delay units according to a control signal.

17. The measuring circuit of claim 1, wherein the target circuit executes the specific software program from the first time point to the second time point.

18. A measuring circuit for quantizing variation in operating speed of a target circuit operating in different operating conditions, the measuring circuit comprising:
a signal generator configured to generate a predetermined signal;
an adjustable delay circuit configured to generate a first delay signal according to the predetermined signal in a first operating condition, and generate a second delay signal according to the predetermined signal in a second operating condition;
a signal detector configured to detect the first delay signal and thereby generate a first detection result, and configured to detect the second delay signal and thereby generate a second detection result; and
a calibrating circuit configured to enable a first number of delay units of the adjustable delay circuit according to the first detection result and thereby limit a delay caused by the first number of delay units of the adjustable delay circuit to a delay threshold, and the calibrating circuit configured to enable a second number of delay units of the adjustable delay circuit according to the second detection result and thereby limit a delay caused by the second number of delay units of the adjustable delay circuit to the delay threshold,
wherein the first number of delay units of the adjustable delay circuit relates to the operating speed of the target circuit operating in the first operating condition, the second number of delay units of the adjustable delay circuit relates to the operating speed of the target circuit operating in the second operating condition, P parametric values of a controllable parameter stand for P operating conditions respectively, the adjustable delay circuit generates P delay signals according to the predetermined signal in the P operating conditions respectively, the signal detector generates P detection results according to the P delay signals respectively, the calibrating circuit enables P kinds of numbers of delay units of the adjustable delay circuit according to the P detection results respectively, the P kinds of numbers of delay units of the adjustable delay circuit relate to the P parametric values respectively, the P is an integer greater than one, and the calibrating circuit outputs P quantized values to an external device via at least one output terminal according to the P kinds of numbers of delay units of the adjustable delay circuit and thereby allows the external device to obtain a relation between a delay caused by the adjustable delay circuit and a variation in the P parametric values.

19. A measuring circuit for quantizing variation in operating speed of a target circuit operating in different operating conditions, the measuring circuit comprising:
a signal generator configured to generate a predetermined signal;

an adjustable delay circuit configured to generate a first delay signal according to the predetermined signal in a first operating condition and generate a second delay signal according to the predetermined signal in a second operating condition, and the adjustable delay circuit including N delay units and a multiplexer, in which the N delay units are connected in series and configured to output N output signals respectively, the multiplexer is configured to receive each of the N output signals of the N delay units and then output one of the N output signals of the N delay units according to a control signal, and each of the N delay units includes:
an input terminal configured to receive an input signal that is the predetermined signal or a delay version of the predetermined signal;
at least one delay component configured to generate an output signal among the N output signals by delaying the input signal; and
an AND gate configured to output a logical conjunction result of the input signal and the output signal among the N output signals; and
a signal detector configured to detect the first delay signal and thereby generate a first detection result, and configured to detect the second delay signal and thereby generate a second detection result; and a calibrating circuit configured to enable a first number of delay units of the adjustable delay circuit according to the first detection result and thereby limit a delay caused by the first number of delay units of the adjustable delay circuit to a delay threshold, and the calibrating circuit configured to enable a second number of delay units of the adjustable delay circuit according to the second detection result and thereby limit a delay caused by the second number of delay units of the adjustable delay circuit to the delay threshold,
wherein the first number of delay units of the adjustable delay circuit relates to the operating speed of the target circuit operating in the first operating condition, the second number of delay units of the adjustable delay circuit relates to the operating speed of the target circuit operating in the second operating condition.

20. The measuring circuit of claim 19, wherein the signal detector is configured to detect a pulse width of the first delay signal and thereby generate the first detection result, and also configured to detect a pulse width of the second delay signal and thereby generate the second detection result.

* * * * *